United States Patent
Chang et al.

(10) Patent No.: US 10,511,228 B2
(45) Date of Patent: Dec. 17, 2019

(54) DC-DC CONVERTING CONTROLLER

(71) Applicant: uPI semiconductor corp., Zhubei, Hsinchu County (TW)

(72) Inventors: Chih-Lien Chang, Zhubei (TW); Min-Rui Lai, Zhubei (TW)

(73) Assignee: UPI SEMICONDUCTOR CORP., Zhubei, Hsinchu County (TW)

( * ) Notice: Subject to any disclaimer, the term of this patent is extended or adjusted under 35 U.S.C. 154(b) by 0 days.

(21) Appl. No.: 16/259,707

(22) Filed: Jan. 28, 2019

(65) Prior Publication Data
US 2019/0245447 A1 Aug. 8, 2019

(30) Foreign Application Priority Data
Feb. 2, 2018 (TW) .............................. 107103890 A

(51) Int. Cl.
*H02M 3/158* (2006.01)
*H02M 1/14* (2006.01)
*H03K 7/08* (2006.01)
*H02M 1/00* (2006.01)

(52) U.S. Cl.
CPC ........... *H02M 3/1588* (2013.01); *H02M 1/14* (2013.01); *H02M 3/1584* (2013.01); *H03K 7/08* (2013.01); *H02M 2001/0009* (2013.01); *H02M 2001/0025* (2013.01)

(58) Field of Classification Search
CPC ...... H02M 3/156; H02M 3/157; H02M 3/158; H02M 3/1582

USPC ......................................... 323/271, 282–285
See application file for complete search history.

(56) References Cited

U.S. PATENT DOCUMENTS

| | | | |
|---|---|---|---|
| 6,246,220 B1 * | 6/2001 | Isham | H02M 3/1588 323/224 |
| 6,683,441 B2 * | 1/2004 | Schiff | H02M 3/1584 323/222 |
| 6,919,715 B2 | 7/2005 | Muratov et al. | |
| 7,274,174 B2 | 9/2007 | Wang et al. | |
| 7,902,800 B2 | 3/2011 | Jain et al. | |
| 8,988,902 B2 * | 3/2015 | Gao | H02M 3/33523 363/19 |

* cited by examiner

*Primary Examiner* — Nguyen Tran
(74) *Attorney, Agent, or Firm* — McClure, Qualey & Rodack, LLP

(57) ABSTRACT

A DC-DC converting controller coupled to an output stage and an external resistor network and providing a pulse-width-modulation (PWM) signal to control the output stage to provide an output voltage is disclosed. The DC-DC converting controller includes a sensing circuit, a droop current circuit, a first pin and a PWM signal control loop. The sensing circuit, coupled to the output stage, provides a sensing current. The droop current circuit, coupled to the sensing circuit, provides a droop current according to the sensing current. The first pin, coupled to the droop current circuit and external resistor network, provides the droop current to make the external resistor network provide a second reference voltage. The PWM signal control loop, coupled to the external resistor network, generates a PWM signal according to the output voltage and the second reference voltage. The droop current is reduced to a default value with a default time.

9 Claims, 4 Drawing Sheets

DC-DC CONVERTING CONTROLLER

BACKGROUND OF THE INVENTION

1. Field of the Invention

The invention relates to power conversion; in particular, to a DC-DC converting controller.

2. Description of the Prior Art

In general, in order to avoid load damage caused by a large instantaneous current when the load is switched from light load to heavy load (i.e., pumping), the conventional DC-DC converting controller usually provides a load line droop function of DC (direct current) type at this time. For example, a droop current of fixed value is provided to a reference voltage supply loop in the feedback circuit, and a reference voltage of the feedback signal is changed through an external resistor to realize the load line droop function.

However, under certain specific usage scenarios, such as overclocking of a central processing unit (CPU), the stability of the output voltage will be particularly valued. At this time, if a voltage drop occurs during heavy load, it will cause unstable output voltage and affect the normal operation of the load. In addition, in some specific applications, such as the graphics processing unit (GPU), there are often cases of light load and heavy load fast switching, which causes the output voltage to be prone to over-shoot or under-shoot during fast switching and the peak-to-peak voltage difference between the over-shoot peak and the under-shoot peak is too large. It will also cause unstable output voltage and seriously affect the normal operation of the load.

SUMMARY OF THE INVENTION

Therefore, the invention provides a DC-DC converting controller to effectively solve the above-mentioned problems in the prior art.

An embodiment of the invention is a DC-DC converting controller. In this embodiment, the DC-DC converting controller is coupled to an output stage and an external resistor network and provides a pulse-width-modulation (PWM) signal to control the output stage to provide an output voltage. The DC-DC converting controller includes a sensing circuit, a droop current circuit, a first pin and a PWM signal control loop. The sensing circuit is coupled to the output stage and provides a sensing current. The droop current circuit is coupled to the sensing circuit and provides a droop current according to the sensing current. The first pin is coupled to the droop current circuit and the external resistor network and receives the droop current and a first reference voltage. The first pin provides the droop current to make the external resistor network provide a second reference voltage. The PWM signal control loop is coupled to the external resistor network and generates the PWM signal according to the second reference voltage and a feedback voltage related to the output voltage. The droop current is reduced to a default value with a default time.

In an embodiment of the invention, the DC-DC converting controller further includes a second pin. The second pin is coupled to the first pin through the external resistor network. The droop current generates the second reference voltage at the second pin through the external resistor network.

In an embodiment of the invention, the DC-DC converting controller further includes a third pin. The third pin is coupled to the output stage and receives the feedback voltage.

In an embodiment of the invention, the pulse-width-modulation signal control loop includes a comparator. Two receiving terminals of the comparator are coupled to the second pin and the third pin and receive the second reference voltage and the feedback voltage respectively. The comparator generates the pulse-width-modulation signal according to the second reference voltage and the feedback voltage.

In an embodiment of the invention, the droop current circuit is also coupled to a node between the second pin and the pulse-width-modulation signal control loop, and the droop current circuit also generates the droop current to the node between the second pin and the pulse-width-modulation signal control loop.

In an embodiment of the invention, the droop current circuit generates a rising voltage which is increased with time according to the sensing current and then generates the droop current according to the rising voltage.

In an embodiment of the invention, the droop current circuit includes an internal capacitor and the droop current circuit charges the internal capacitor through the sensing current to generate the rising voltage which is increased with time.

In an embodiment of the invention, the droop current circuit generates a fixed voltage according to the sensing current and then generates the droop current according to the fixed voltage and the rising voltage which is increased with time.

In an embodiment of the invention, the droop current circuit further includes a current mirror. The current mirror includes two transistors and gates of the two transistors are butted to each other. The droop current circuit replicates a plurality of droop currents through the current mirror and then outputs the plurality of droop currents.

Compared to the prior art, the DC-DC converting controller of the invention converts the sensed total output current into a droop current which is decreased with time through the droop current circuit, and the droop current passes through an external resistor disposed between the DAC pin and the EAP pin to generate a reference voltage which is decreased with time on the EAP pin, which not only improves the over-shoot and under-shoot of the output voltage of the DC-DC converting controller during the fast switching between loading and unloading in a short period of time to effectively reduce the peak-to-peak voltage difference between the over-shoot peak and the under-shoot peak of the output voltage curve, but also avoids the load line droop during normal operation to improve the stability of the output voltage.

The advantage and spirit of the invention may be understood by the following detailed descriptions together with the appended drawings.

BRIEF DESCRIPTION OF THE APPENDED DRAWINGS

DETAILED DESCRIPTION OF THE INVENTION

Figure 1:
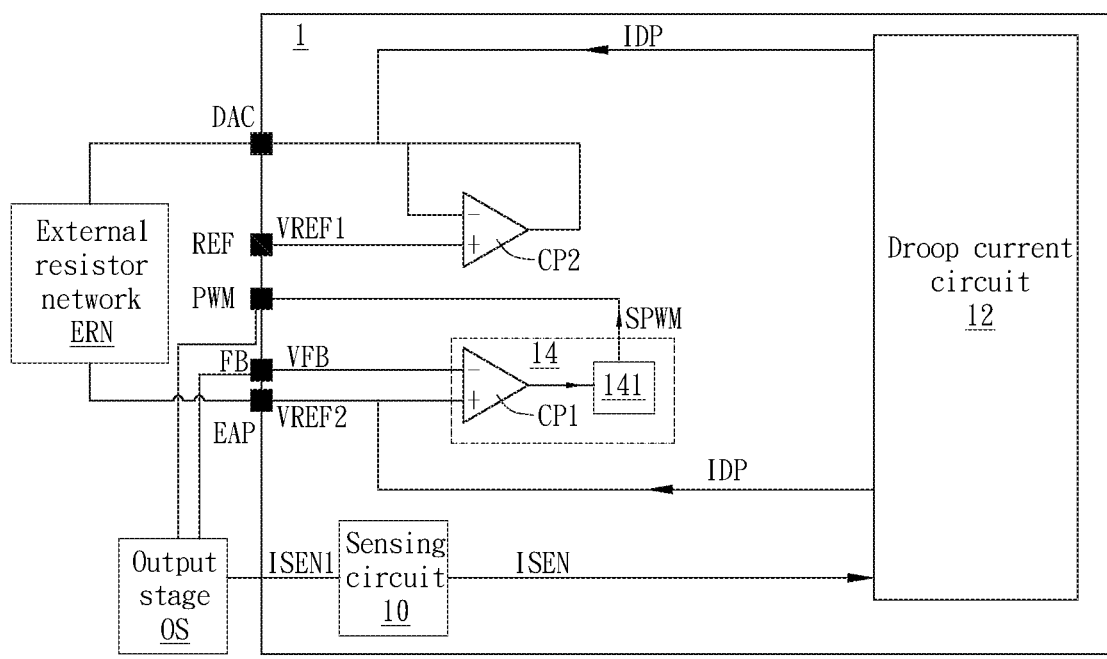
FIG. 1 illustrates a schematic diagram of a DC-DC converting controller in an embodiment of the invention.

Exemplary embodiments of the present invention are referenced in detail now, and examples of the exemplary embodiments are illustrated in the drawings. Further, the same or similar reference numerals of the elements/components in the drawings and the detailed description of the invention are used on behalf of the same or similar parts.

An embodiment of the invention is a DC-DC converting controller. In this embodiment, the DC-DC converting controller senses an output current of an output stage and converts the output current into a droop current which is deceased with time through a droop current circuit to make the peak-to-peak voltage difference of the output voltage curve become smaller during the fast switching between loading and unloading in a short period of time, so that the stability of the output voltage can be maintained.

Please refer to FIG. 1. FIG. 1 illustrates a schematic diagram of a DC-DC converting controller in this embodiment. As shown in FIG. 1, the DC-DC converting controller 1 is coupled to an output stage OS and an external resistor network ERN. The DC-DC conversion controller 1 provides a pulse-width-modulation signal SPWM to the output stage OS to control the output stage OS to provide an output voltage VOUT. In practical applications, the external resistor network ERN can include at least one external resistor and the output stage OS can include two transistors coupled in series with each other and a driving integrated circuit thereof, but not limited to this.

In this embodiment, the DC-DC converting controller 1 includes a sensing circuit 10, a droop current circuit 12, a pulse-width-modulation signal control loop 14, a first pin DAC, a second pin EAP, a third pin FB, a fourth pin REF, a fifth pin PWM and a voltage follower CP2. The sensing circuit 10 is coupled between the output stage OS and the droop current circuit 12; the droop current circuit 12 is coupled to the first pin DAC, the voltage follower CP2, the second pin EAP and the pulse-width-modulation signal control loop 14; the pulse-width-modulation signal control loop 14 is coupled to the second pin EAP, the third pin FB and the fifth pin PWM respectively, and the pulse-width-modulation signal control loop 14 can include a comparator CP1 and a pulse-width-modulation signal generator 141, but not limited to this; the voltage follower CP2 is coupled to the first pin DAC and the fourth pin REF respectively; the external resistor network ERN is coupled to a node between the first pin DAC and the second pin EAP; the output stage OS is coupled to the third pin FB, the fifth pin PWM and the sensing circuit 10 respectively; the first pin DAC is coupled to the external resistor network ERN and the voltage follower CP2 respectively; the second pin EAP is coupled to the external resistor network ERN and the pulse-width-modulation signal control loop 14 respectively; the third pin FB is coupled to the output stage OS and the pulse-width-modulation signal control loop 14 respectively; the fourth pin REF is coupled to the voltage follower CP2; the fifth pin PWM is coupled to the output stage OS and the pulse-width-modulation signal control loop 14 respectively.

The sensing circuit 10 is used to sense the current output by the output stage OS and provide the sensing current ISEN to the droop current circuit 12 according to the sensing result ISEN1. When the droop current circuit 12 receives the sensing current ISEN, the droop current circuit 12 will generate a droop current IDP according to the sensing current ISEN, and the droop current IDP will be decreased to a default value according to a default time. For example, the droop current IDP can be decreased to zero with time, but not limited to this.

Next, the droop current circuit 12 provides the droop current IDP which is decreased with time to the first pin DAC. The negative input terminal − and the output terminal of the voltage follower CP2 are coupled. The positive input terminal + of the voltage follower CP2 receives the first reference voltage VREF1 from the fourth pin REF and outputs the first reference voltage VREF1 to the first pin DAC through the output terminal. Therefore, the first pin DAC will receive the droop current IDP which is decreased with time and the first reference voltage VREF1 having a fixed voltage value respectively.

Then, the droop current IDP outputted by the first pin DAC flows through the external resistor network ERN and generates a second reference voltage VREF2 at the second pin EAP through the external resistor network ERN. It should be noted that since the droop current IDP through the external resistor network ERN is decreased with time, the second reference voltage VREF2 generated at the second pin EAP by the droop current IDP flowing through the external resistor network ERN is also decreased with time. Since the droop current IDP is a gradient value, it can be regarded as an alternating current (AC) type load line droop, and the level of the output voltage VOUT is effectively maintained by the second reference voltage VREF2 which is gradually recovered.

Then, the negative input terminal − and the positive input terminal + of the comparator CP1 in the pulse-width-modulation signal control circuit 14 receive the feedback voltage VFB from the third pin FB and the second reference voltage VREF2 from the second pin EAP respectively. And, the pulse-width-modulation signal generator 141 generates a pulse-width-modulation signal SPWM and provides the pulse-width-modulation signal SPWM to the output stage OS through the fifth pin PWM to control the output stage OS to provide the output voltage VOUT. In addition, the droop current circuit 12 also provides the droop current IDP between the second pin EAP and the positive input terminal + of the comparator CP1.

It should be noted that the third pin FB receives the feedback voltage VFB from the output stage OS, and the feedback voltage VFB is related to the output voltage VOUT, and the second reference voltage VREF2 is decreased with time.

Figure 2:
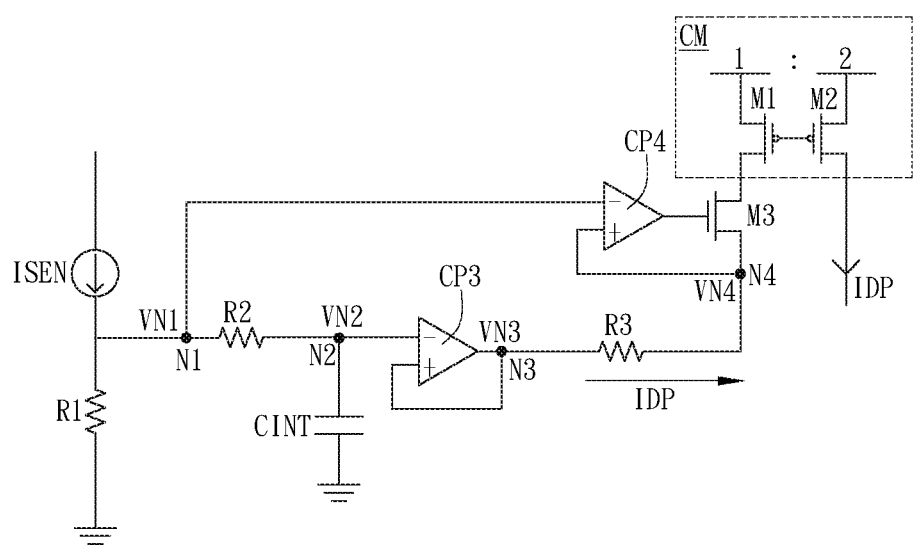
FIG. 2 illustrates an embodiment of the droop current circuit 12 in FIG. 1 generating the droop current IDP according to the sensing current ISEN.

Next, please refer to FIG. 2. FIG. 2 illustrates an embodiment of the droop current circuit 12 of FIG. 1 generating the droop current IDP according to the sensing current ISEN. As shown in FIG. 2, the droop current circuit 12 includes an internal capacitor CINT, resistors R1~R3, a first node N1 to a fourth node N4, a current mirror CM, a transistor M3, a voltage follower CP3 and a comparator CP4. In practical applications, the current mirror CM can include two transistors M1 and M2 and the gates of the two transistors M1 and M2 are butted to each other; the resistance of the resistor R3 can be twice the resistance of the resistor R1; the resistance of the resistor R2 can be 2 MΩ and the capacitance of the internal capacitor CINT can be 40 pF, but not limited to this.

The resistor R1 is coupled between the sensing current ISEN and the ground; the first node N1 is located between the sensing current ISEN and the resistor R1; the resistor R2 is coupled between the first node N1 and the second node N2; the internal capacitor CINT is coupled between the second node N2 and the ground; the positive input terminal + and the output terminal of the voltage follower CP3 are coupled to the third node N3 and the negative input terminal − of the voltage follower CP3 is coupled to the second node N2; the resistor R3 is coupled between the third node N3 and the fourth node N4; the negative input terminal − and the positive input terminal + of the comparator CP4 are coupled to the first node N1 and the fourth node N4 respectively, and the output terminal of the comparator CP4 is coupled to the gate of the transistor M3; the transistor M3 is coupled between the current mirror CM and the fourth node N4, and the gate of the transistor M3 is coupled to the output terminal of the comparator CP4; the current mirror CM is coupled to the transistor M3 and outputs the droop current IDP.

Figure 3:
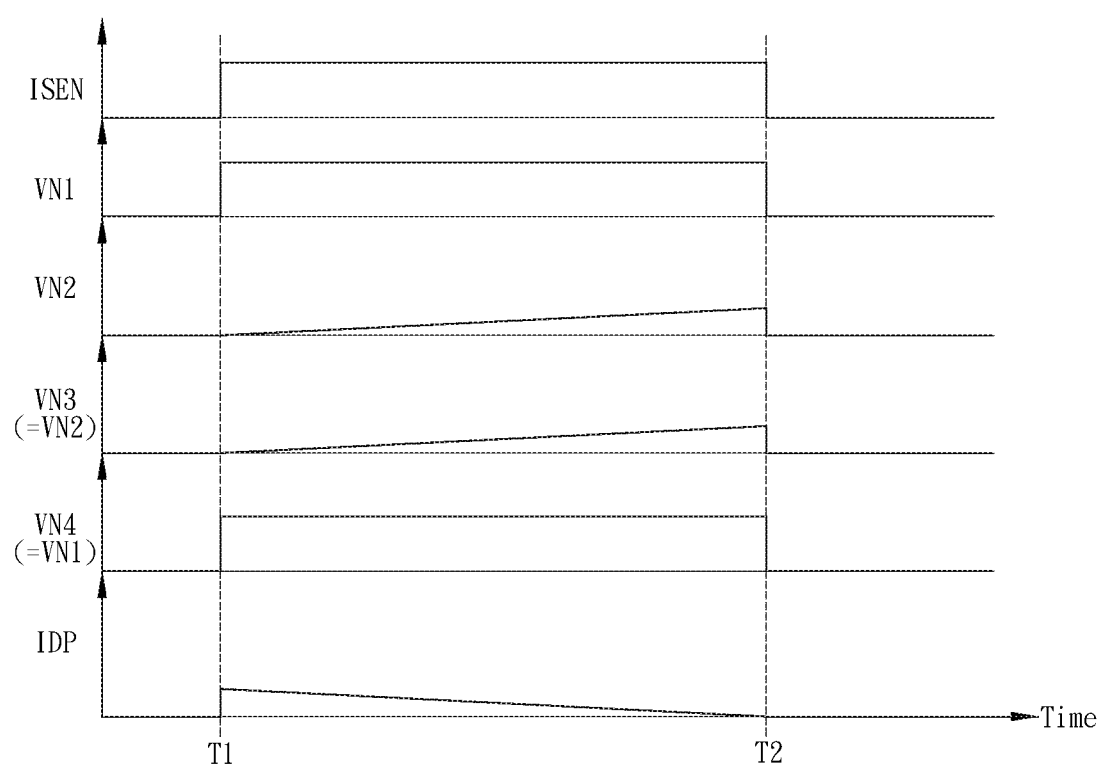
FIG. 3 illustrates timing diagrams of the sensing current ISEN, the first node voltage VN1~the fourth node voltage VN4 and the droop voltage IDP under the condition of switching from light load to heavy load at the first time and from heavy load to light load at the second time.

Please also refer to FIG. 3. FIG. 3 illustrates timing diagrams of the sensing current ISEN, the first node voltage VN1~the fourth node voltage VN4 and the droop voltage IDP under the condition of switching from light load to heavy load (e.g., pumping) at the first time T1 and from heavy load to light load (e.g., unloading) at the second time T2.

When the droop current circuit 12 receives the sensing current ISEN (or a current signal related to the sensing current ISEN, such as a load current) having a fixed voltage value, the sensing current ISEN will pass through the resistor R1 and generate a first node voltage VN1 at the first node N1, and the first node voltage VN1 is a fixed voltage value. At the same time, the sensing current ISEN will charge the internal capacitor CINT and generate a second node voltage VN2 which is increased with time at the second node N2, and lock a third node voltage VN3 at the third node N3 through the voltage follower CP3 to make the third node voltage VN3 equal to the second node voltage VN2. That is to say, the third node voltage VN3 is also increased with time. At this time, a fourth node voltage VN4 of the fourth node N4 will be equal to the first node voltage VN1 of the first node N1. That is to say, the fourth node voltage VN4 is a fixed voltage value. Since the third node voltage VN3 will be increased with time and the fourth node voltage VN4 has the fixed voltage value, the voltage difference between the fourth node voltage VN4 and the third node voltage VN3 will generate a droop current IDP which is decreased with time on the resistor R3. And, the droop current IDP will be inputted to the current mirror CM through the transistor M3, and then the current mirror CM will replicate a plurality of droop currents IDPs and then output the plurality of droop currents IDPs.

It should be noted that the droop current IDP of the invention will be reduced to a default value with a default time, thereby eliminating the phenomenon of load line drop. In this embodiment, the droop current IDP is linearly decreased from the first time T1 until the droop current IDP is reduced to zero at the second time T2. That is to say, the default time in this embodiment is the second time T2 minus the first time T1 and the default value is zero, but not limited to this.

Figure 4:
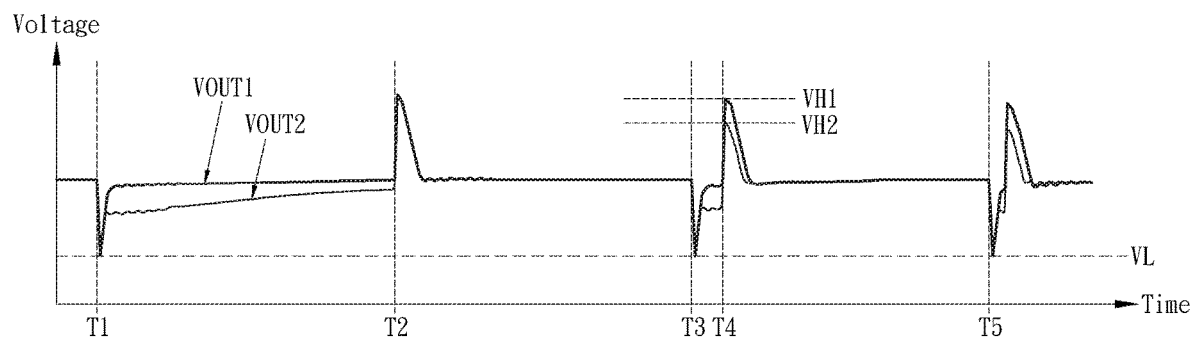
FIG. 4 illustrates timing diagrams of the second output voltage curve VOUT2 in the invention and the first output voltage curve VOUT1 in the prior art.

Please also refer to FIG. 4. FIG. 4 illustrates timing diagrams of the second output voltage curve VOUT2 in the invention and the first output voltage curve VOUT1 in the prior art.

As shown in FIG. 4, when the load is switched from light load to heavy load (e.g., pumping) at the first time T1, an under-shoot phenomenon occurs. At this time, the under-shoot peak value of the second output voltage curve VOUT2 in the invention and the under-shoot peak value of the first output voltage curve VOUT1 in the prior art are both VL, but the droop current IDP will be decreased to a default value with a default time. After the default time, the level of the second output voltage curve VOUT2 will be recovered near the level of the first output voltage curve VOUT1; therefore, it can effectively reduce the impact of load line drop on the output voltage.

When the load is continuously pumped and unloaded, the under-shoot phenomenon occurs when the load is switched from light load to heavy load (e.g., pumping) at the third time T3. At this time, the under-shoot peak value of the second output voltage curve VOUT2 in the invention and the under-shoot peak value of the first output voltage curve VOUT1 in the prior art are both VL; when the load is switched from heavy load to light load (e.g., unloading) at the fourth time T4, an over-shoot phenomenon occurs, the over-shoot peak value VH2 of the second output voltage curve VOUT2 in the invention is significantly lower than the over-shoot peak value VH1 of the first output voltage curve VOUT1 in the prior art, so that the peak-to-peak voltage difference of the second output voltage curve VOUT2 in the invention is smaller than that of the first output voltage curve VOUT1 in the prior art. Therefore, the stability of the output voltage can be effectively improved.

According to the practical simulation results, it is assumed that the load current is 200 amps, and the output voltage is reduced to 0.93 volts by the load line droop when pumping at the first time T1; the time interval between the first time T1 and the second time T2 of unloading is 100 micro-seconds, during this time interval, the level of the second output voltage curve VOUT2 will be gradually recovered with time; at the second time T2, the level of the second output voltage curve VOUT2 in the invention is recovered to about 0.985 volts which is near the original output voltage level (1 volt).

If the time interval between the third time T3 of the pumping and the fourth time T4 of the unloading is 10 microseconds, according to the practical simulation result, it can be found that the under-shoot peak values VL of the second output voltage curve VOUT2 in the invention and the under-shoot peak value of the first output voltage curve VOUT1 in the prior art are both 0.803 volts, and the over-shoot peak value VH2 of the second output voltage curve VOUT2 in the invention is 1.157 volts and the over-shoot peak value VH1 of the first output voltage curve VOUT1 in the prior art is 1.217 volts, so that the peak-to-peak voltage difference (1.157−0.803=0.354 volts) of the second output voltage curve VOUT2 in the invention is smaller than the peak-to-peak voltage difference (1.217−0.803=0.414 volts) of the first output voltage curve VOUT1 in the prior art. The rest can be deduced by analogy, so it will not be described here.

Compared to the prior art, the DC-DC converting controller of the invention converts the sensed total output current into a droop current which is decreased with time through the droop current circuit, and the droop current passes through an external resistor disposed between the DAC pin and the EAP pin to generate a reference voltage which is decreased with time on the EAP pin, which not only improves the over-shoot and under-shoot of the output voltage of the DC-DC converting controller during the fast switching between loading and unloading in a short period of time to effectively reduce the peak-to-peak voltage difference between the over-shoot peak and the under-shoot peak of the output voltage curve, but also avoids the load line droop during normal operation to improve the stability of the output voltage.

What is claimed is:

1. A DC-DC converting controller, coupled to an output stage and an external resistor network and providing a pulse-width-modulation signal to control the output stage to provide an output voltage, the DC-DC converting controller comprising:
a sensing circuit, coupled to the output stage and providing a sensing current;
a droop current circuit, coupled to the sensing circuit and providing a droop current according to the sensing current;
a first pin, coupled to the droop current circuit and the external resistor network and receiving the droop current and a first reference voltage, wherein the first pin provides the droop current to the external resistor network to make the external resistor network provide a second reference voltage; and
a pulse-width-modulation signal control loop, coupled to the external resistor network and generating the pulse-width-modulation signal according to the second reference voltage and a feedback voltage related to the output voltage,
wherein the droop current is reduced to a default value with a default time.

2. The DC-DC converting controller of claim 1, further comprising:
a second pin, coupled to the first pin through the external resistor network, wherein the droop current generates the second reference voltage at the second pin through the external resistor network.

3. The DC-DC converting controller of claim 2, further comprising:
a third pin, coupled to the output stage and receiving the feedback voltage.

4. The DC-DC converting controller of claim 3, wherein the pulse-width-modulation signal control loop comprises a comparator, two receiving terminals of the comparator are coupled to the second pin and the third pin and receive the second reference voltage and the feedback voltage respectively, the comparator generates the pulse-width-modulation signal according to the second reference voltage and the feedback voltage.

5. The DC-DC converting controller of claim 2, wherein the droop current circuit is also coupled to a node between the second pin and the pulse-width-modulation signal control loop, and the droop current circuit also generates the droop current to the node between the second pin and the pulse-width-modulation signal control loop.

6. The DC-DC converting controller of claim 1, wherein the droop current circuit generates a rising voltage which is increased with time according to the sensing current and then generates the droop current according to the rising voltage.

7. The DC-DC converting controller of claim 6, wherein the droop current circuit comprises an internal capacitor and the droop current circuit charges the internal capacitor through the sensing current to generate the rising voltage which is increased with time.

8. The DC-DC converting controller of claim 6, wherein the droop current circuit generates a fixed voltage according to the sensing current and then generates the droop current according to the fixed voltage and the rising voltage which is increased with time.

9. The DC-DC converting controller of claim 8, wherein the droop current circuit further comprises a current mirror, the current mirror comprises two transistors and gates of the two transistors are butted to each other, the droop current circuit replicates a plurality of droop currents through the current mirror and then outputs the plurality of droop currents.

* * * * *